US012640343B2

(12) United States Patent
Yeom et al.

(10) Patent No.: US 12,640,343 B2
(45) Date of Patent: May 26, 2026

(54) PLASMA ETCHING METHOD AND PLASMA ETCHING DEVICE

(71) Applicant: Research & Business Foundation SUNGKYUNKWAN UNIVERSITY, Suwon-si (KR)

(72) Inventors: Geun Young Yeom, Seoul (KR); Wonjun Chang, Seoul (KR); Hee Ju Kim, Seoul (KR); Ji Eun Kang, Yongin-si (KR); Soo Nam Goong, Suwon-si (KR); Jong Woo Hong, Goyang-si (KR)

(73) Assignee: RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 202 days.

(21) Appl. No.: 18/370,444

(22) Filed: Sep. 20, 2023

(65) Prior Publication Data

US 2024/0096596 A1     Mar. 21, 2024

(30) Foreign Application Priority Data

Sep. 20, 2022   (KR) ........................ 10-2022-0118881

(51) Int. Cl.
*H01J 37/32* (2006.01)
*G03F 7/36* (2006.01)
*H10P 76/20* (2026.01)

(52) U.S. Cl.
CPC .............. *H01J 37/321* (2013.01); *G03F 7/36* (2013.01); *H01J 37/32449* (2013.01); *H10P*

*76/204* (2026.01); *H01J 2237/334* (2013.01); *H01J 2237/336* (2013.01)

(58) Field of Classification Search
None
See application file for complete search history.

(56) References Cited

U.S. PATENT DOCUMENTS

| | | | |
|---|---|---|---|
| 8,329,585 B2 * | 12/2012 | Sheu ................. | H01J 37/32091 438/689 |
| 8,551,689 B2 | 10/2013 | Park et al. | |
| 2012/0031875 A1 * | 2/2012 | Hosoya ............. | H01J 37/32697 156/345.51 |
| 2015/0294880 A1 * | 10/2015 | Anderson ......... | H01L 21/31116 438/719 |

FOREIGN PATENT DOCUMENTS

| | | |
|---|---|---|
| KR | 10-2005-0011871 A | 1/2005 |
| KR | 10-2012-0022582 A | 3/2012 |
| KR | 10-2019-0085654 A | 7/2019 |

* cited by examiner

*Primary Examiner* — Binh X Tran
(74) *Attorney, Agent, or Firm* — LEX IP MEISTER, PLLC

(57) ABSTRACT

The present invention introduces a plasma etching method and apparatus. The plasma etching method may include forming a photoresist pattern on a target etching layer, hardening the surface of the photoresist pattern by exposing to a first plasma generated from a first discharge gas containing a reforming gas including carbon (C) and sulfur (S) and sequentially annealing, and etching the target etching layer with a second plasma generated from a second discharge gas using the surface-hardened photoresist pattern as a mask.

12 Claims, 11 Drawing Sheets

FIG. 1

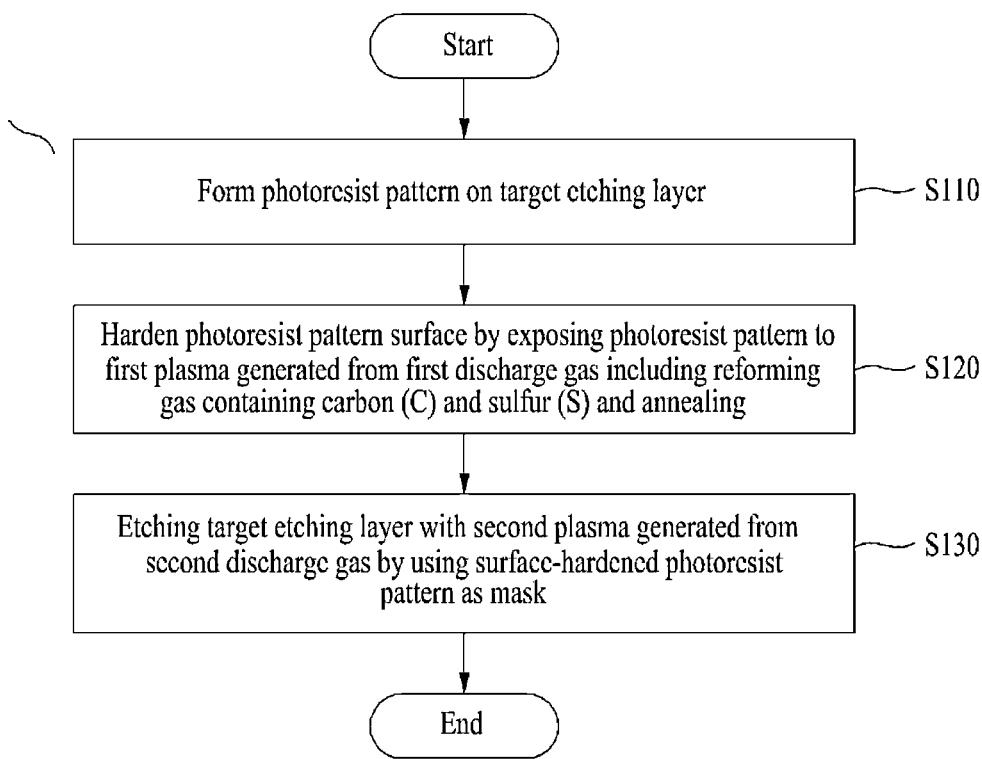

Start

1

Form photoresist pattern on target etching layer — S110

Harden photoresist pattern surface by exposing photoresist pattern to first plasma generated from first discharge gas including reforming gas containing carbon (C) and sulfur (S) and annealing — S120

Etching target etching layer with second plasma generated from second discharge gas by using surface-hardened photoresist pattern as mask — S130

End

Before etching

PLASMA ETCHING METHOD AND PLASMA ETCHING DEVICE

CROSS REFERENCE TO RELATED APPLICATIONS

This application claims the benefit under 35 USC 119(a) of Korean Patent Application No. 10-2022-0118881 filed on Sep. 20, 2022 in the Korean Intellectual Property Office, the entire disclosure of which is incorporated herein by reference for all purposes.

BACKGROUND OF THE INVENTION

The present invention relates to a plasma etching method and apparatus.

DESCRIPTION OF THE RELATED ART

As the pattern critical dimension (CD) decreases, the decrease in mask selectivity and the degradation of line edge roughness/line width roughness (LER/LWR) during the etching process are acknowledged as crucial parameters that significantly affect the performance of the final device. The decrease in mask selectivity can hinder achieving the intended etching depth and potentially result in pattern distortion instead of a vertical profile due to mask collapse.

The deterioration of LER/LWR can lead to problems such as increased resistance and potential leakage issues due to the transfer of deteriorated patterns to the underlying layer. There is therefore a need for a method capable of maintaining low LER/LWR while the process proceeds with a high selectivity.

SUMMARY OF THE INVENTION

It is an object of the present invention to provide a plasma etching method capable of achieving excellent pattern transfer by ensuring high etching selectivity and low LER/LWR.

It is another object of the present invention to provide a plasma etching apparatus capable of implementing the aforementioned plasma etching method.

A plasma etching method according to an embodiment of the present invention may include forming a photoresist pattern on a target etching layer, hardening a surface of the photoresist pattern by exposing the photoresist pattern to a first plasma generated from a first discharge gas containing a reforming gas including carbon (C) and sulfur (S) and annealing the photoresist pattern, and etching the target etching layer with a second plasma generated from a second discharge gas using the surface-hardened photoresist pattern as a mask.

In one embodiment, the first discharge gas may further include an inert gas.

In one embodiment, the plasma etching method may generate plasma by discharging the first discharge gas at a pressure of about 2 mtorr to 1 torr.

In one embodiment, the reforming gas may include $CS_2$.

In one embodiment, the plasma etching method may generate plasma by supplying $CS_2$ at a flow rate of about 10 sccm to 1 slm for use in generating the plasma.

In one embodiment, the plasma etching method may generate the first plasma and the second plasma using an inductively coupled plasma method, a capacitively coupled plasma method, or a microwave plasma method.

In one embodiment, the plasma etching method may generate the first plasma by the inductively coupled plasma with a power of about 20 to 1000 W.

In one embodiment, the plasma etching method may expose the photoresist pattern to the first plasma for about 1 second to 5 minutes.

In one embodiment, the plasma etching method proceeds with the target etching layer and the photoresist pattern placed on an electrode, and with the electrode being floated or applied with a negative DC voltage or an RF voltage while exposing the photoresist pattern to the first plasma.

In one embodiment, the plasma etching method may anneal the floating electrode at about 40 to 200° C.

In one embodiment, the plasma etching method may anneal the support electrode at about 40 to 150° C. for about 1 to 20 minutes.

In one embodiment, the second discharge gas may include an etching gas containing at least one material selected among a group consisting of chlorine compounds, fluorine compounds, $Cl_2$, $BCl_3$, $HBr$, $NH_3$, $CF_4$, $CHF_3$, $C_2F_6$, $CH_2F_2$, $SF_6$, $C_xF_yH_z$ (where x is a natural number from 1 to 6, y is a natural number from 4 to 8, and z is a natural number from 1 to 4), $NF_3$, $N_2$, $H_2$, $O_2$, $CO_2$, $CO$, and $COS$, and an inert gas containing at least one material selected among the group consisting of He, Ar, Kr, Xe, and Ne.

In one embodiment, the etching may be carried out under the second plasma for about 30 to 60 seconds.

In an embodiment, the etching resistance of the photoresist pattern may be increased by about 50 to 80% when hardening the surface of the photoresist before proceeding with the etching process, compared to proceeding with the etching process without surface-hardening.

In one embodiment, the exposing to the first plasma, the annealing, and the etching with the second plasma may be performed sequentially within a single chamber or separately in multiple chambers.

A plasma etching apparatus according to an embodiment of the present invention may include a chamber, a first electrode accommodated within the chamber to be capable of placing the target for etching and heating and applying voltage, a second electrode accommodated and arranged within the chamber, facing the first electrode, to be capable of discharging gas within the chamber; and a gas supply unit capable of supplying the first discharge gas or the second discharge gas to the chamber.

In one embodiment, the first discharge gas may include a reforming gas containing carbon and sulfur and an inert gas.

In one embodiment, the second discharge gas may include an etching gas containing at least one material selected among a group consisting of chlorine compounds, fluorine compounds, $Cl_2$, $BCl_3$, $HBr$, $NH_3$, $CF_4$, $CHF_3$, $C_2F_6$, $CH_2F_2$, $SF_6$, $C_xF_yH_z$ (where x is a natural number from 1 to 6, y is a natural number from 4 to 8, and z is a natural number from 1 to 4), $NF_3$, $N_2$, $H_2$, $O_2$, $CO_2$, $CO$, and $COS$; and an inert gas containing at least one material selected among the group consisting of He, Ar, Kr, Xe, and Ne.

A plasma etching apparatus according to an embodiment of the present invention may include a chamber, a first electrode accommodated within the chamber to be capable of placing the target for etching and heating and applying voltage, an antenna electrode configured to discharge the gas inside the chamber from the outside of the chamber to generate plasma, and a gas supply unit capable of supplying the first discharge gas or the second discharge gas to the chamber.

In one embodiment, the first discharge gas may include a reforming gas containing carbon and sulfur and an inert gas.

In one embodiment, the second discharge gas may include an etching gas containing at least one material selected among a group consisting of chlorine compounds, fluorine compounds, $Cl_2$, $BCl_3$, HBr, $NH_3$, $CF_4$, $CHF_3$, $C_2F_6$, $CH_2F_2$, $SF_6$, $C_xF_yH_z$, (where x is a natural number from 1 to 6, y is a natural number from 4 to 8, and z is a natural number from 1 to 4), $NF_3$, $N_2$, $H_2$, $O_2$, $CO_2$, CO, and COS, and an inert gas containing at least one material selected among the group consisting of He, Ar, Kr, Xe, and Ne.

BRIEF DESCRIPTION OF THE DRAWINGS

FIG. 1 is a flowchart illustrating a plasma etching method according to an embodiment of the present invention;

DETAILED DESCRIPTION OF THE INVENTION

Figure 2:
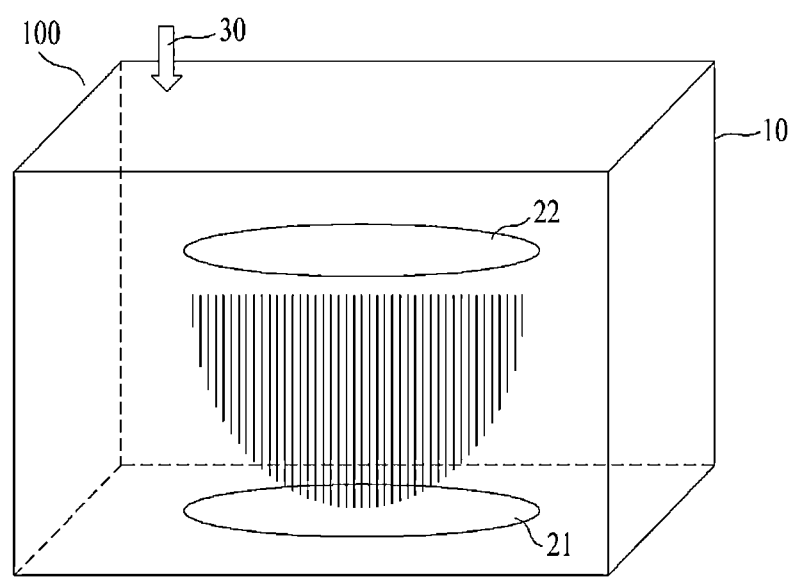
FIG. 2 is a schematic diagram illustrating a plasma etching apparatus according to an embodiment of the present invention.

Hereinafter, embodiments of the present invention will be described in detail with reference to accompanying drawings. Since the present invention can be subject to various changes and modifications, the preferred embodiments are illustrated in the drawings and described in detail in the specification. However, such embodiments are not intended to limit the invention and it should be understood that the embodiment include all changes, equivalents, and substitutes within the spirit and scope of the invention.

Throughout the drawings, like reference numerals refer to like components. In the accompanying drawings, the dimensions of the structures may be enlarged to show the invention more clearly.

The terminology used in this application is employed merely to describe specific embodiments and is not intended to limit the scope of the present invention. As used herein, the singular forms are intended to include the plural forms as well, unless the context clearly indicates otherwise.

In this application, terms such as "include" or "have' are intended to indicate the presence of features, numbers, steps, operations, components, or combinations thereof as disclosed in the specification, but should be understood not to preclude the presence or possibility of one or more other features, numbers, steps, operations, components, or combinations thereof.

Unless otherwise defined herein, all terms including technical or scientific terms used herein have the same meanings as commonly understood by those skilled in the art to which the present invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein.

FIG. 1 is a flowchart illustrating a plasma etching method according to an embodiment of the present invention.

With reference to FIG. 1, the plasma etching method according to an embodiment of the present invention includes forming, at step S110, a photoresist pattern on a target etching layer, hardening, at step S120, the surface of the photoresist pattern by exposing to a first plasma generated from a first discharge gas containing a reforming gas including carbon (C) and sulfur (S) and sequentially annealing, and etching, at step S130, the target etching layer with a second plasma generated from a second discharge gas using the surface-hardened photoresist pattern as a mask.

The pattern formation step S110 involves forming the photoresist pattern on the target etching layer. In the context of this specification, "target etching layer" refers to the layer to be etched, and particularly in the plasma etching method according to an embodiment of the present invention, it refers to the layer containing the material subject to the etching. In the context of this specification, "photoresist" refers to photosensitive resins collectively, and particularly in the plasma etching method according to an embodiment of the present invention, it may refer to the material formed on the target etching layer to prevent etching of the target etching layer. Accordingly, the pattern formation step S110 involves determining a pattern where the target etching layer is etched and forming the pattern of the photoresist on the areas where etching is not intended.

The hardening step S120 involves hardening the surface of the photoresist pattern by exposing the photoresist pattern to the first plasma generated from the first discharge gas containing a reforming gas including carbon (C) and sulfur (S) and sequentially annealing. The hardening step proceeds in at least two stages, the first stage of exposure to plasma, particularly the first plasma, and the second stage of annealing. The exposure to plasma and annealing may be performed in a manner in which exposure to plasma is performed first, and annealing is performed after completion, or in a manner in which exposure to plasma and annealing are performed simultaneously.

Here, the first discharge gas is the gas that is discharged to generate the first plasma. The first discharge gas may form plasma by breaking the chemical bonds of the molecules contained in the gas and/or by ionizing the electrons of the atoms and molecules contained in the gas due to the voltage applied from outside. This invention is based on the discovery that exposing a photoresist pattern to the first plasma generated from the first discharge gas can cause sulfurization, when the first discharge gas contains a reforming gas including carbon (C) and sulfur (S), on at least the surface of a photoresist pattern. The sulfurization of the photoresist may induce hardening of the photoresist, thereby improving its etching resistance. The type of reforming gas is not specifically limited as long as it performs the function described above. In one embodiment, the reforming gas may include $CS_2$.

In addition, the first discharge gas may include other gases in addition to the reforming gas. In particular, the first discharge gas may include a gas that enables the generation of activated sulfur chemical species from the reforming gas through the discharge that forms the first plasma. In one embodiment, the first discharge gas may further include an inert gas.

In order to accomplish the above objects, the process of exposing the photoresist pattern to the first plasma generated from the first discharge gas may be performed by applying various process variables. In one embodiment, the plasma etching method may generate plasma by discharging the first discharge gas at a pressure of 2 mtorr to 1 torr. In one embodiment, the plasma etching method may generate plasma by discharging the first discharge gas at a pressure of about 2 to 100 mtorr. In one embodiment, the plasma etching method may generate plasma by discharging the first discharge gas at a pressure of about 8 to mtorr. In one embodiment, the pressure of the discharge gas may vary depending on the volume of the chamber or the type of plasma discharge. In one embodiment, the plasma etching method may generate plasma by supplying $CS_2$ at a flow rate of about 10 sccm to 1 slm. In one embodiment, the plasma etching method may generate plasma by supplying $CS_2$ at a flow rate of about 10 to 30 sccm. In one embodiment, the flow rate of the discharge gas may increase or decrease depending on the volume of the chamber, the plasma discharge method, or the pressure control method.

In order to accomplish the above objects, various methods may be used to generate the first plasma from the first discharge gas. In one embodiment, the plasma etching method may generate the first plasma and the second plasma using inductively coupled plasma, capacitively coupled plasma, or microwave plasma methods. In one embodiment, the plasma etching method may generate the first plasma using inductively coupled plasma with a power of about 20 to 1000 W. In one embodiment, the plasma etching method may generate the first plasma using inductively coupled plasma with a power of about 40 to 60 W. In one embodiment, the plasma etching method may expose the photoresist pattern to the first plasma for about 1 second to 5 minutes. In one embodiment, the plasma etching method may expose the photoresist pattern to the first plasma for about 2 to 5 minutes.

Meanwhile, in one embodiment, the plasma etching method proceeds with the target etching layer and the photoresist pattern placed on a support electrode at step S110, the support electrode being floated or applied with a negative DC voltage or an RF voltage while the photoresist pattern being exposed to the first plasma at step S110. In the context of this specification, the phrase "float the electrode" may imply that the electrode is not connected to any other component. In one embodiment, the plasma etching method may apply voltage to the target etching layer and the photoresist pattern while exposing the photoresist pattern to the first plasma. In particular, applying voltage to the target etching layer and the photoresist layer may allow the first plasma to be more efficiently applied to the photoresist layer.

Furthermore, the present invention is based on the discovery that annealing the photoresist, when the first plasma causes sulfurization of the photoresist, can diffuse the sulfurization occurring on the surface of the photoresist into its interior, resulting in a more uniform etching resistance. Therefore, the annealing should be carried out within an appropriate temperature and time range that allows the diffusion of sulfurization occurring in the photoresist without destroying the photoresist itself. In one embodiment, the plasma etching method may anneal the support electrode at about 40 to 200° C. In one embodiment, the plasma etching method may anneal the floating electrode at about 40 to 150° C. In one embodiment, the plasma etching method may anneal the support electrode at about 40 to 150° C. for about 1 to 20 minutes. In one embodiment, the plasma etching method may anneal the floating electrode at about 70 to 90° C. for about 10 to 20 minutes.

The etching step S130 involves etching the target etching layer with the second plasma generated from the second discharge gas using the surface-hardened photoresist pattern as a mask. Here, the second discharge gas may be a gas discharged to generate the second plasma. The type of the second discharge gas is not specifically limited as long as it can perform the etching function described above. In one embodiment, the second discharge gas may include etching gas and inert gas. In one embodiment, the second discharge gas may include an etching gas containing at least one material selected among a group consisting of chlorine compounds, fluorine compounds, $Cl_2$, $BCl_3$, $HBr$, $NH_3$, $CF_4$, $CHF_3$, $C_2F_6$, $CH_2F_2$, $SF_6$, $C_xF_yH_z$ (where x is a natural number from 1 to 6, y is a natural number from 4 to 8, and z is a natural number from 1 to 4), $NF_3$, $N_2$, $H_2$, $O_2$, $CO_2$, CO, and COS, and an inert gas containing at least one material selected among the group consisting of He, Ar, Kr, Xe, and Ne.

In one embodiment, the etching may be carried out under the second plasma for about 30 to 60 seconds.

As described above, the plasma etching method according to an embodiment of the present invention is capable of achieving a high etching selectivity and low LER/LWR by proceeding etching after hardening the photoresist pattern to improve etching resistance. The plasma etching method according to an embodiment of the present invention is capable of improving the etching resistance of the photoresist pattern by hardening the surface of the photoresist before proceeding with the etching process. The plasma etching method according to an embodiment of the present invention is capable of increasing the etching resistance of the photoresist pattern by about 50 to 80% by hardening the surface of the photoresist before proceeding with the etching process, compared to proceeding with the etching process without the surface-hardening step.

In one embodiment, the exposure to the first plasma, the annealing, and the etching with the second plasma may be performed sequentially within a single chamber or separately in multiple chambers.

FIG. 2 is a schematic diagram illustrating a plasma etching apparatus according to an embodiment of the present invention.

With reference to FIG. 2, the plasma etching apparatus according to an embodiment of the present invention may include a chamber 10, a first electrode 21 accommodated within the chamber to be capable of placing the target for etching and heating and applying voltage, a second electrode 22 accommodated and arranged within the chamber 10, facing the first electrode 21, to be capable of discharging gas inside the chamber 10; and a gas supply unit 30 capable of supplying the first discharge gas or the second discharge gas to the chamber 10.

The chamber 10 is the part where etching is performed in the plasma etching apparatus 100 according to an embodiment of the present invention, and the necessary components and gases for etching are accommodated in the interior of the chamber 10.

The first and second electrodes 21 and 22 are components capable of generating plasma by discharging the gases accommodated inside the chamber 10. That is, the gases accommodated inside the chamber 10 are discharged by the voltage applied to the first and second electrodes 21 and 22 to generate plasma.

The first electrode 21 is a component allowing for the target to be etched by the plasma etching apparatus 100 according to an embodiment of the present invention to be placed thereon. The first electrode 21 may have voltage applied, as described above, to discharge the gas for generating plasma, and alternatively, additionally, or optionally, may include a component to adjust the temperature of, especially to heat, the first electrode 21.

The second electrode 22 is a component capable of generating plasma by applying voltage. In particular, the second electrode 22 is positioned inside the chamber to directly discharge gas, and this configuration allows for the implementation of a capacitively coupled plasma method through the above configuration. In addition, direct current (DC) voltage or radio frequency (RF) voltage may be applied to the second electrode 22.

The gas supply unit 30 is a device capable of supplying discharge gas inside the chamber 10. In particular, the gas supply unit 30 may supply both the first discharge gas for hardening the photoresist pattern and the second discharge gas for etching.

Other descriptions of the plasma etching apparatus 100 according to an embodiment of the present invention may identically or similarly employ the descriptions of the identical or similar components described in the plasma etching method 1 according to an embodiment of the present invention. Accordingly, in one embodiment, the first discharge gas may include a reforming gas containing carbon and sulfur and an inert gas. In one embodiment, the second discharge gas may include etching gas and inert gas. In one embodiment, the second discharge gas may include etching gases containing at least one material selected among a group consisting of chlorine compounds, fluorine compounds, $Cl_2$, $BCl_3$, HBr, $NH_3$, $CF_4$, $CHF_3$, $C_2F_6$, $CH_2F_2$, $SF_6$, $C_xF_yH_z$ (where x is a natural number from 1 to 6, y is a natural number from 4 to 8, and z is a natural number from 1 to 4), $NF_3$, $N_2$, $H_2$, $O_2$, $CO_2$, CO, and COS; and inert gases containing at least one material selected among the group consisting of He, Ar, Kr, Xe, and Ne.

Figure 3:
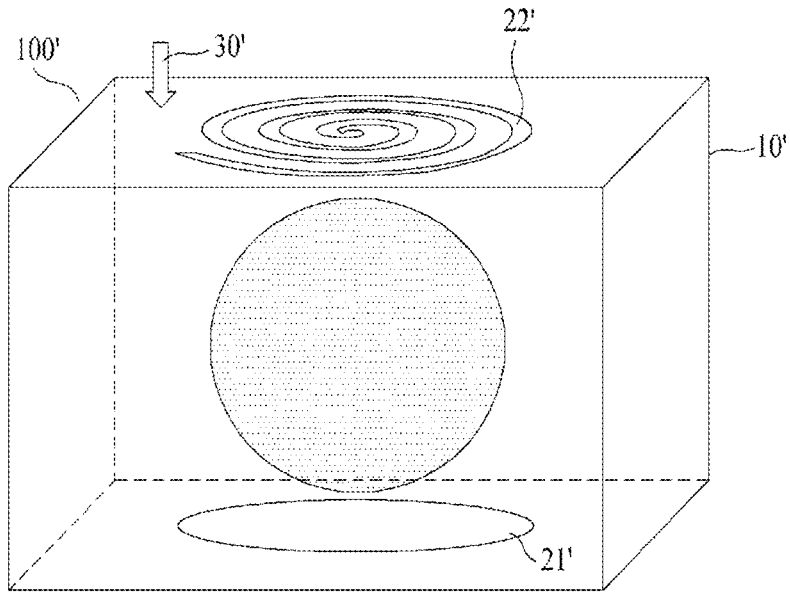
FIG. 3 is a schematic diagram illustrating a plasma etching apparatus according to another embodiment of the present invention.

FIG. 3 is a schematic diagram illustrating a plasma etching apparatus according to another embodiment of the present invention.

With reference to FIG. 3, the plasma etching apparatus according to an embodiment of the present invention may include a chamber 10', a first electrode 21' accommodated within the chamber 10' to be capable of placing the target for etching and heating and applying voltage, an antenna electrode 22' configured to discharge the gas inside the chamber 10' from the outside of the chamber 10', and a gas supply unit 30' capable of supplying the first discharge gas or the second discharge gas to the chamber 10'.

Other descriptions of the plasma etching apparatus 100' according to an embodiment of the present invention may identically or similarly employ the descriptions of the identical or similar components of the plasma etching apparatus 100 according to an embodiment of the present invention. In particular, except for the differences in their functional aspects, the description of the antenna electrode 22' may identically or similarly employ the description of the second electrode 22.

Accordingly, the chamber 10' is the part where etching is performed in the plasma etching apparatus 100' according to an embodiment of the present invention, and the necessary components and gases for etching are accommodated in the interior of the chamber 10'.

The first electrode 21' is a component allowing for the target to be etched by the plasma etching apparatus 100' according to an embodiment of the present invention to be placed thereon.

The first electrode 21' may have voltage applied, as described above, to discharge the gas for generating plasma, and alternatively, additionally, or optionally, may include a component to adjust the temperature of, especially to heat, the first electrode 21'.

The antenna electrode 22' is a component capable of generating plasma by applying voltage. In particular, the antenna electrode 22' is positioned outside the chamber 10' to discharge the gas, and this configuration allows for the implementation of an inductively coupled plasma method. Although the antenna electrode 22' is depicted as being positioned on the top of the chamber 10' in FIG. 3, this configuration is merely illustrative, and the position of the antenna electrode 22' is not specifically limited as long as it can generate plasma in the chamber 10' through the inductively coupled plasma method. In addition, direct current (DC) voltage or radio frequency (RF) voltage may be applied to the antenna electrode 22'.

The gas supply unit 30' is a device capable of supplying discharge gas inside the chamber 10'. In particular, the gas supply unit 30' may supply both the first discharge gas for hardening the photoresist pattern and the second discharge gas for etching.

In one embodiment, the first discharge gas may include a reforming gas containing carbon and sulfur and an inert gas. In one embodiment, the second discharge gas may include etching gas and inert gas. In one embodiment, the second discharge gas may include an etching gas containing at least one material selected among a group consisting of chlorine compounds, fluorine compounds, $Cl_2$, $BCl_3$, HBr, $NH_3$, $CF_4$, $CHF_3$, $C_2F_6$, $CH_2F_2$, $SF_6$, $C_xF_yH_z$ (where x is a natural number from 1 to 6, y is a natural number from 4 to 8, and z is a natural number from 1 to 4), $NF_3$, $N_2$, $H_2$, $O_2$, $CO_2$, CO, and COS, and an inert gas containing at least one material selected among the group consisting of He, Ar, Kr, Xe, and Ne.

Other descriptions of the plasma etching apparatuses 100 and 100' according to embodiments of the present invention may identically or similarly employ the identical or similar components described in the plasma etching method 1 according to an embodiment of the present invention. Therefore, the process variables described in the plasma etching method 1 according to an embodiment of the present invention may be applied identically or similarly to the plasma etching apparatuses 100 and 100' according to embodiments of the present invention.

As described above, the plasma etching apparatuses 100 and 100' according to embodiments of the present invention may implement the plasma etching method 1 according to an embodiment of the present invention.

Hereinafter, a description is made of an embodiment of the present invention in detail. The following embodiment is merely exemplary, and the scope of the present invention is not limited to this specific embodiment.

Plasma Etching

After forming a photoresist pattern on the target etching layer, a plasma was generated using a first discharge gas containing $CS_2$ to reform the photoresist pattern. Plasma generation was achieved using an inductively coupled plasma method (ICP) with a power of 50 W, a flow rate of 20 sccm for $CS_2$, and a pressure of 9 mtorr, and the reforming process took approximately 3 minutes. Subsequently, annealing was conducted for 15 minutes at 80° C.

After completing the reforming process, etching was carried out. The discharge gas used for etching was a mixture of $CF_4$ and argon, with a flow rate ratio of $CF_4$ to argon of 4:40 sccm. The chamber pressure was 3 mtorr, and ICP was used with a power of 1000 W. The etching process was carried out for 40 seconds.

SEM Image Observation

Figure 4:
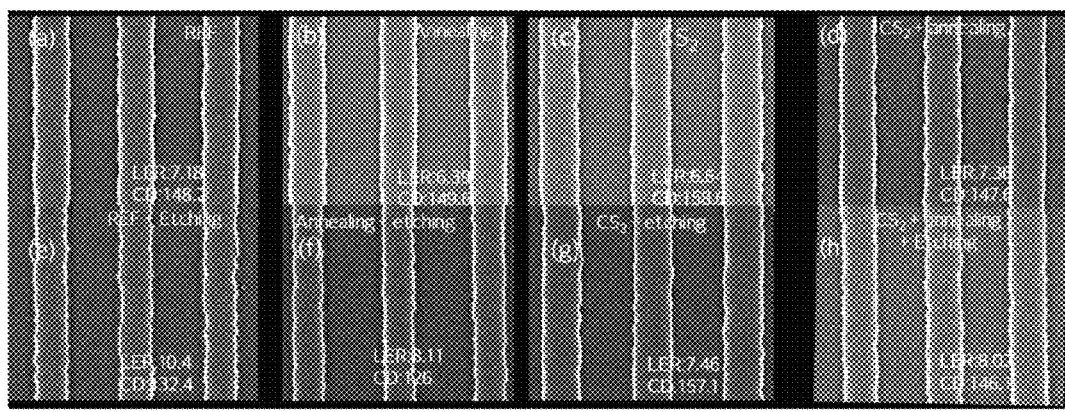
FIG. 4 is an image showing the results of obtaining SEM image for the plasma etching method of FIG. 1.

FIG. 4 is the result of obtaining SEM images for the plasma etching method.

In FIG. 4, (a) represents the reference state, i.e., pattern formation only, (b) represents the annealing state only, (c) represents the reforming state only, (d) represents the reforming and annealing state, (e) represents the state after etching the reference, (f) represents the state after annealing only and then etching, (g) represents the state after reforming only and then etching, and (h) represents the state after reforming and annealing and then etching.

With reference to 4, when the reforming process is not performed, when only the annealing process is carried out, and when only the $CS_2$ plasma treatment is applied, there was a significant variation in LER and CD. When the plasma treatment and annealing are conducted together, there was no significant variation in LER and CD compared to the reference sample, and even after etching, the LER and CD variations were marginal, confirming an improvement in plasma etching resistance.

LER, CD, and Thickness Measurements

Figure 5:
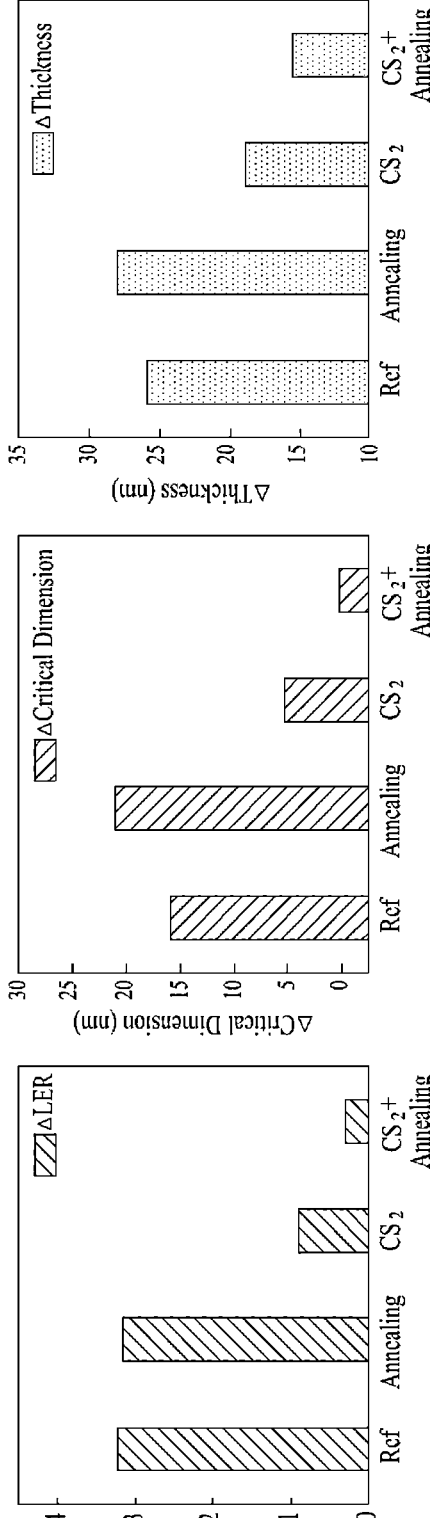
FIG. 5 is graphs respectively showing LER variation, CD variation, film thickness variation.

FIG. 5 is graphs respectively showing LER variation, CD variation, film thickness variation.

The labels Ref, Annealing, $CS_2$, and $CS_2$+Annealing in FIG. are as described in FIG. 4.

With reference to FIG. 5, in the case of the photoresist with no treatment and the photoresist with only annealing, it can be observed that the LER variation, CD variation, and thickness reduction are significant. After $CS_2$ plasma treatment, it can be observed that LER variation, CD variation, and thickness reduction are decreased, confirming an improvement in plasma etching resistance. In the case of the sample where both $CS_2$ plasma treatment and annealing were conducted simultaneously, it can be observed that the LER variation, CD variation, and thickness reduction are minimized, confirming the highest improvement in plasma etching resistance. In conclusion, it can be confirmed that the maximum improvement in plasma etching resistance is not achieved with plasma treatment alone, but when $CS_2$ plasma treatment and annealing processes are conducted together, the effects of minimizing LER variation, CD reduction, and PR thickness reduction can be observed, leading to an enhancement in selectivity.

Etching Rate (ER)

Figure 6:
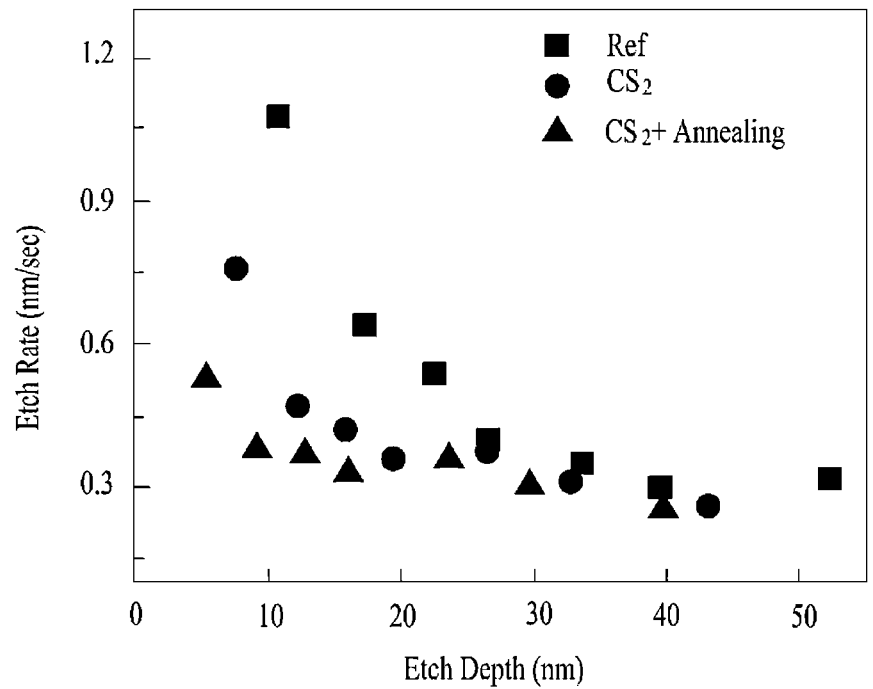
FIG. 6 is a graph showing the etching rate (ER) of photoresists undergone no processing, undergone only $CS_2$ processing, and undergone $CS_2$ processing and annealing, respectively, at different depths of etching.

FIG. 6 is a graph showing the etching rate (ER) of photoresists undergone no processing, undergone only $CS_2$ processing, and undergone $CS_2$ processing and annealing, respectively, at different depths of etching.

With reference to FIG. 6, in the case of the photoresist with no treatment, the ER from 0 to approximately 20 nm is observed to be 1.08 to 0.54 nm/sec. In the case of the photoresist treated with $CS_2$ plasma, it can be observed that the ER decreased to 0.76 to 0.36 nm/sec. That is, it can be confirmed that the plasma etching resistance was improved compared to the untreated photoresist. In the case of the photoresist subjected to both $CS_2$ plasma treatment and annealing, the ER decreased to 0.53 to 0.36 nm/sec, confirming the most significant improvement in plasma etching resistance. However, it can be observed that the ER is uniform from a position of 25 nm in the photoresist, without any ER deviation among three samples. This suggests that the plasma treatment or the annealing performed along with the treatment may have modified the properties of solely the surface of the photoresist.

Depth-Wise Sulfurization Observation

Figure 7:
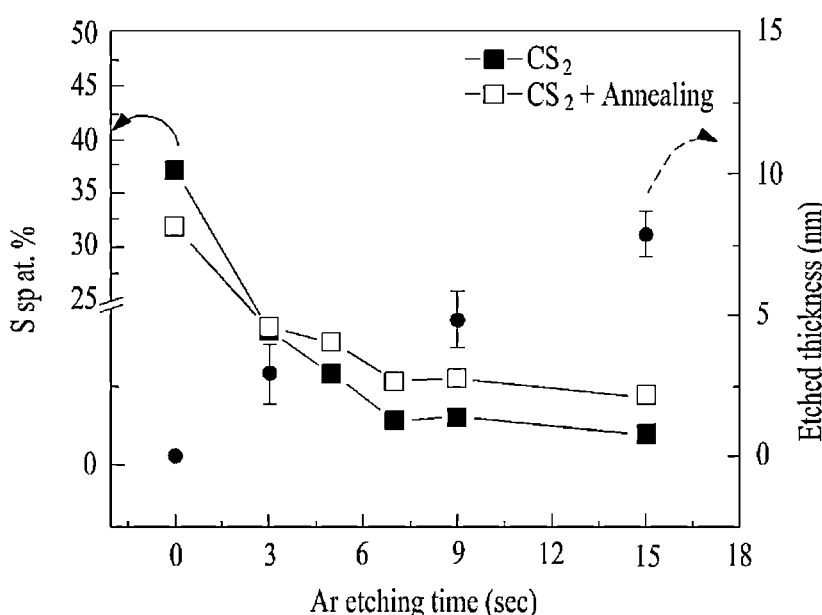
FIG. 7 is a graph showing the observation result of the degree of sulfurization at different depths of a photoresist after $CS_2$ processing and annealing, compared to a photoresist only undergone $CS_2$ processing, through argon (Ar) ion beam sputtering to identify the cause of the improved selectivity of a photoresist annealed after $CS_2$ processing.

FIG. 7 shows the observation result of the degree of sulfurization at different depths of a photoresist after $CS_2$ processing and annealing, compared to a photoresist only undergone $CS_2$ processing, through argon (Ar) ion beam sputtering to identify the cause of the improved selectivity of a photoresist annealed after $CS_2$ processing.

With reference to FIG. 7, in the sample subjected to $CS_2$ plasma treatment, sulfurization of 37.19% is observed on the surface, and it can be observed that it rapidly decreases to 4.3% when sputtered to a depth of about 3 nm. It can be observed that the sulfurization decreases to the level of 1% when the argon sputtering time is 15 seconds (approximately 7.9 nm etching). In the case of the photoresist subjected to both $CS_2$ plasma treatment and annealing, it can be observed that there is 31.78% sulfurization on the surface, and the sulfurization decreases to 4.4% when sputtered to a depth of approximately 3 nm. In contrast to the sample subjected to only plasma treatment, it can be observed that the reduction in sulfurization is smaller, at around 2% when sputtered for 15 seconds (approximately 7.9 nm etching).

X-Ray Photoelectron Spectroscopy (XPS)

Figure 8A:
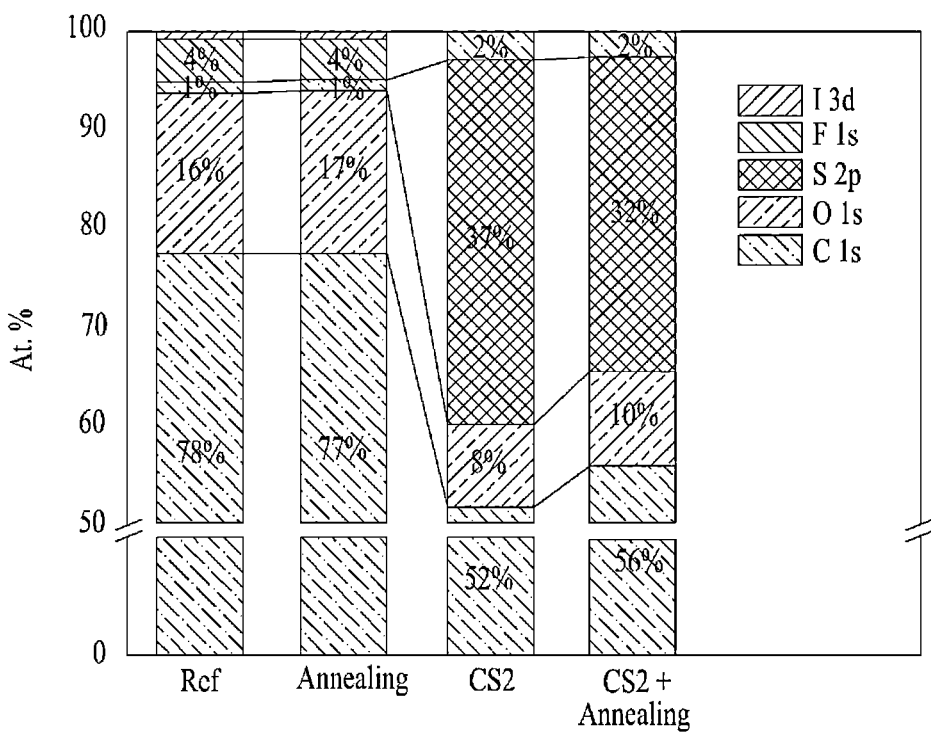
FIG. 8A is a graph showing the atomic percentage obtained by XPS analysis of the surface of each sample before etching.
Figure 8B:
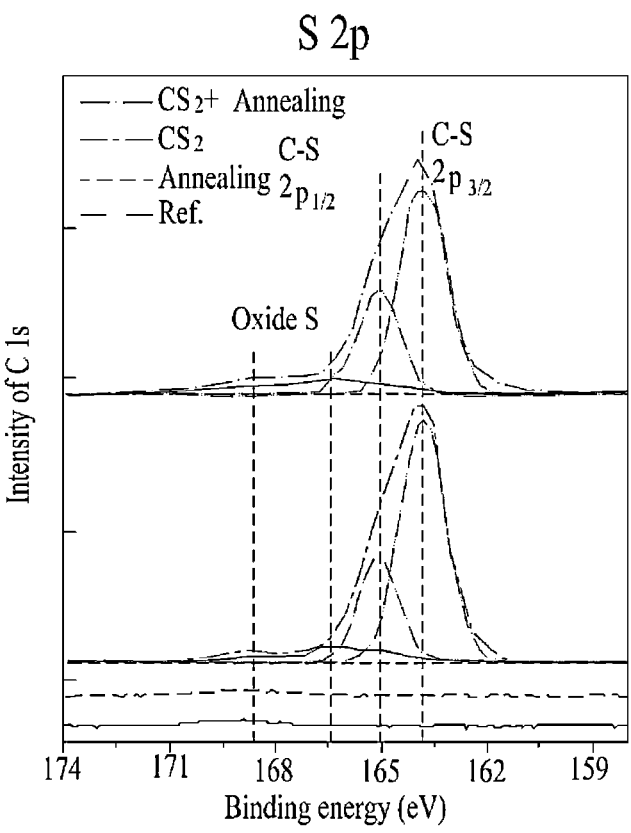
FIG. 8B is a graph showing the electronic state and chemical activity of sulfur (S) elements in the XPS spectrum of the surface of each sample before etching.
Figure 8C:
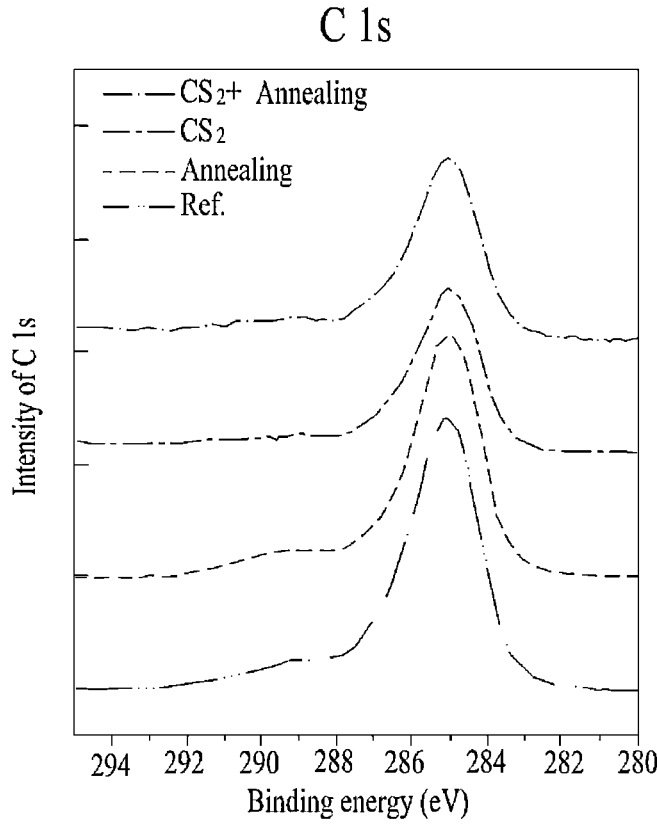
FIG. 8C is a graph showing the electronic state and chemical activity of carbon elements in the XPS spectrum of the surface of each sample before etching.

FIGS. 8A to 8C show the results of XPS analysis of the surfaces of the samples before the etching process.

With reference to FIG. 8, it can be observed that the degree of sulfurization increases in the case of the photoresist subjected to $CS_2$ treatment only and the photoresist subjected to both $CS_2$ treatment and annealing compared to the reference (no treatment). In the case of the photoresist subjected to annealing, it can be observed that the peak width of the strong sulfur oxide in the binding energy is wider, indicating a higher quantity of sulfur oxide compared to the photoresist treated with $CS_2$ alone.

Figure 9:
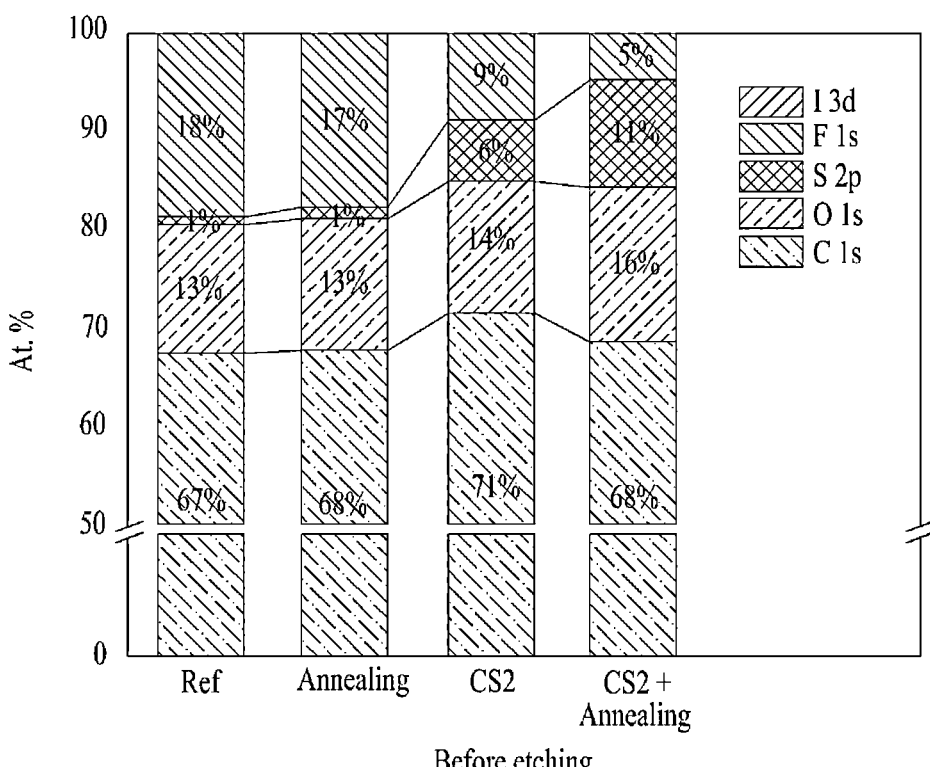
FIG. 9 is a graph showing the results of XPS analysis of the surfaces of the samples used in the experiments of FIGS. 8A to 8C after being etched for 3 seconds with CF4 as a discharge gas.

FIG. 9 shows the results of XPS analysis of the surfaces of the samples used in the experiments of FIGS. 8A to 8C after being etched for 3 seconds with $CF_4$ as a discharge gas.

With reference to FIG. 9, it can be observed that the amount of residual sulfur in the photoresist subjected to $CS_2$ treatment and annealing is the highest, indicating the best etching resistance. In conclusion, it can be confirmed that both the $CS_2$ plasma treatment and annealing should be carried out to maximize corrosion resistance.

Consideration of Annealing Temperature

Figure 10:
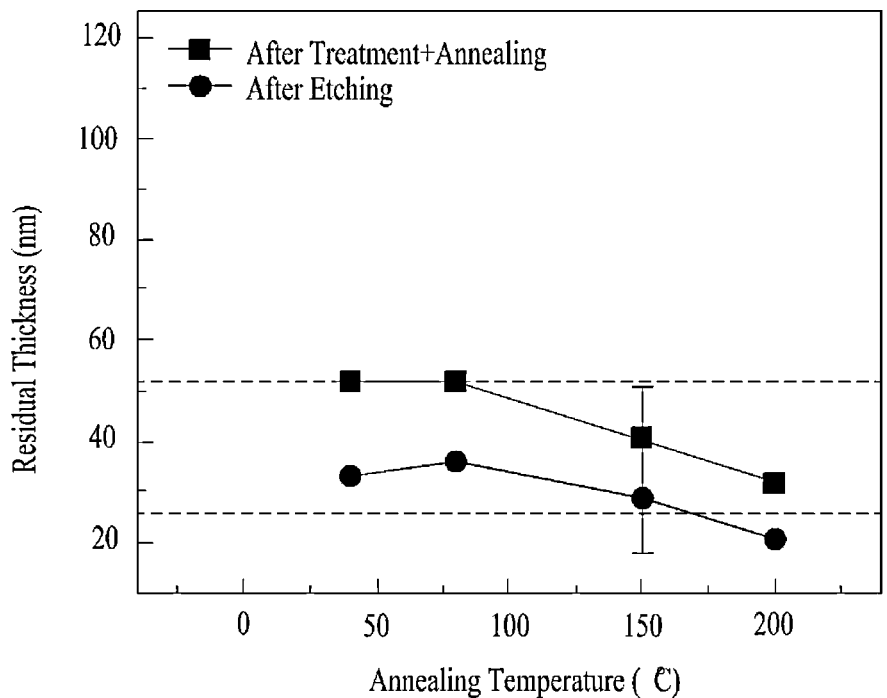
FIG. 10 is a graph showing the results of observing the thickness of the samples according to the annealing temperature.

FIG. 10 shows the results of observing the thickness of the samples according to the annealing temperature.

By nature of the photoresist composed of organic materials, annealing at excessively high temperatures may lead to structural collapse and reduction in the size of the photoresist, resulting in pattern failure. In the plasma etching method according to an embodiment of the present invention, annealing is performed to enhance the plasma etching resistance. Therefore, after processing, the change in thickness should be minimized, and the remaining photoresist after etching should be as thick as possible.

With reference to FIG. 10, it can be observed that the photoresist used in the experiment shows no change in thickness at approximately 80° C., maintaining the thickest residual thickness. It can be confirmed that maintaining an optimal temperature is essential to prevent structural collapse and size reduction of the photoresist due to excessively high temperatures.

The plasma etching method according to an embodiment of the present invention is capable of achieving a high etching selectivity and low LER/LWR by proceeding etching after hardening the photoresist pattern to improve etching resistance.

A plasma etching apparatus according to an embodiment of the present invention is capable of implementing a plasma etching method according to an embodiment of the present invention.

Although the preferred embodiments of this invention have been described above, it will be understood by those skilled in the art that this invention can be variously modified and changed without departing from the spirit and scope of this invention as set forth in the following patent claims.

DESCRIPTION OF REFERENCE NUMERALS

1: Plasma etching method
100, 100': plasma etching apparatus
10, 10': chamber
21, 21': first electrode
22: second electrode
22': antenna electrode
30, 30': gas supply unit

What is claimed is:

1. A plasma etching method comprising:
forming a photoresist pattern on a target etching layer;
hardening a surface of the photoresist pattern by exposing the photoresist pattern to a first plasma generated from a first discharge gas containing a reforming gas including carbon (C) and sulfur(S) and annealing the photoresist pattern; and
etching the target etching layer with a second plasma generated from a second discharge gas using the surface-hardened photoresist pattern as a mask,
wherein the photoresist pattern is annealed at 40 to 200° C. and wherein the reforming gas comprises $CS_2$, which is supplied at a rate of 10 sccm to 1 slm for use in generating the plasma.

2. The plasma etching method of claim 1, wherein the photoresist pattern is annealed at 40 to 150° C. for 1 to 20 minutes.

3. The plasma etching method of claim 1, wherein the etching proceeds after hardening the surface to increase the etching resistance compared to the etching proceeding without hardening the surface.

4. The plasma etching method of claim 1, wherein the exposing to the first plasma, the annealing, and the etching with the second plasma are performed sequentially within a single chamber or separately in multiple chambers.

5. The plasma etching method of claim 1, wherein the first discharge gas comprises an inert gas.

6. The plasma etching method of claim 5, wherein the first discharge gas is discharged at a pressure of 2 mtorr to 1 torr to generate plasma.

7. The plasma etching method of claim 1, wherein the second discharge gas comprises an etching gas containing at least one material selected among the group consisting of chlorine compounds, fluorine compounds, $Cl_2$, $BCl_3$, HBr, $NH_3$, $CF_4$, $CHF_3$, $C_2F_6$, $CH_2F_2$, $SF_6$, $C_xF_yH_z$ where x is a natural number from 1 to 6, y is a natural number from 4 to 8, and z is a natural number from 1 to 4, $NF_3$, $N_2$, $H_2$, $O_2$, $CO_2$, CO, and COS, and an inert gas containing at least one material selected among the group consisting of He, Ar, Kr, Xe, and Ne.

8. The plasma etching method of claim 7, wherein the etching proceeds under the second plasma for 2 to 600 seconds.

9. The plasma etching method of claim 1, wherein the first plasma and the second plasma are generated by an inductively coupled plasma method, a capacitively coupled plasma method, or a microwave plasma method.

10. The plasma etching method of claim 9, wherein the first plasma is generated by the inductively coupled plasma method with a power of 20 to 1000 W.

11. The plasma etching method of claim 10, wherein the photoresist pattern is exposed to the first plasma for 1 second to 5 minutes.

12. The plasma etching method of claim 11, wherein the forming of the photoresist pattern is proceeded in the state of the target etching layer and the photoresist pattern being placed on a support electrode, the support electrode being floated or applied with a negative DC voltage or an RF voltage while the photoresist pattern being exposed to the first plasma.

* * * * *